United States Patent
Larsen et al.

(10) Patent No.: US 8,223,049 B2
(45) Date of Patent: Jul. 17, 2012

(54) CHARGE INJECTION MECHANISM FOR ANALOG-TO-DIGITAL CONVERTERS

(75) Inventors: Fredrik Larsen, Trondheim (NO); Frode Milch Pedersen, Trondheim (NO); Jan Rune Herheim, Trondheim (NO); Ronan Barzic, Tiller (NO)

(73) Assignee: Atmel Corporation, San Jose, CA (US)

( * ) Notice: Subject to any disclaimer, the term of this patent is extended or adjusted under 35 U.S.C. 154(b) by 48 days.

(21) Appl. No.: 12/959,317

(22) Filed: Dec. 2, 2010

(65) Prior Publication Data

US 2012/0139767 A1 Jun. 7, 2012

(51) Int. Cl.
*H03M 1/00* (2006.01)
(52) U.S. Cl. .......... 341/122; 341/144; 341/155; 341/159
(58) Field of Classification Search .................. 341/122, 341/144, 155, 166, 159
See application file for complete search history.

(56) References Cited

U.S. PATENT DOCUMENTS

| | | | | |
|---|---|---|---|---|
| 4,631,518 A | * | 12/1986 | Caspell | 341/122 |
| 5,014,055 A | * | 5/1991 | Dingwall et al. | 341/159 |
| 5,117,227 A | * | 5/1992 | Goeke | 341/166 |
| 6,570,516 B1 | * | 5/2003 | Barker | 341/122 |
| 7,414,562 B2 | * | 8/2008 | Kok et al. | 341/155 |
| 2006/0033650 A1 | * | 2/2006 | Leung et al. | 341/143 |

* cited by examiner

*Primary Examiner* — Jean B Jeanglaude
(74) *Attorney, Agent, or Firm* — Fish & Richardson P.C.

(57) ABSTRACT

A low-cost charge injection mechanism may enable oversampling to be used on low frequency signals by injecting dither noise into the ADC input. The dither noise can reduce the quantization noise allowing even direct current (DC) signals to be oversampled correctly. A low-cost charge injection mechanism can also be used to improve the ENOB by characterizing the ADC and digitally correcting the converted signal for non-linearity errors such as INL. Reducing INL errors may also allow a higher degree of oversampling to be used to further improve the ENOB.

15 Claims, 2 Drawing Sheets

CHARGE INJECTION MECHANISM FOR ANALOG-TO-DIGITAL CONVERTERS

TECHNICAL FIELD

This subject matter is generally related to integrated circuits, and more particularly to analog-to-digital converters.

BACKGROUND

An analog-to-digital converter (ADC) is a part of many microcontrollers. Conventional embedded ADC solutions have a good sample rate but poor resolution. One reason for poor resolution is that cost increases exponentially with increased resolution. Each extra bit of resolution can double a requirement on linearity and accuracy of an analog design. By contrast, sample rate does not increase cost exponentially and thus is easier to improve in an ADC design.

For ADC applications that do not need a fast sample rate, an excess sample rate can be traded for better resolution, given that the input signal is not too slow and that the linearity of the ADC is good. Trading sample rate for resolution can be accomplished by oversampling the ADC input signal and then averaging the result. Oversampling lowers the noise floor in the pass band of interest. In general, the signal-to-noise ratio (SNR) increases by 3 dB or 0.5 bits for every doubling of sample rate.

A slowly changing ADC input signal can pose a problem. For averaging to work, the ADC input signal should trigger different quantization codes. If the ADC input signal is more or less static, then no matter how many samples are averaged, resolution may not be increased beyond the native resolution of the ADC. To address this issue, dither noise can be added to the ADC input signal.

While oversampling can interpolate between ADC codes, it may not improve the integral non-linearity (INL) of the ADC. If the ADC is nonlinear, then the oversampled result will be equally nonlinear. This keeps the Effective Number of Bits (ENOB) from improving, even though the relative resolution has improved.

Adding dither noise and compensating for bad ADC linearity can be expensive. For example, adding dither noise may require a fast noise source that is white and a circuit of active and passive components to amplify and superimpose this dither noise on the ADC input signal. The dithering circuitry can be calibrated at production so the level of dither noise superimposed on the ADC input signal is within about +/−1 LSB. Adding more dither noise than 1 LSB may not affect quantization noise removal, but may instead decrease the SNR.

Correcting for INL errors can include characterizing the ADC using a more accurate ADC or DAC. Characterization information can be stored on the device and used to digitally correct each ADC sample for INL error. Characterizing can be performed in production and the correction information (e.g., a compensation table) can be stored on the device. However, characterizing during production and storing the correction information on the device can increase cost.

SUMMARY

A low-cost charge injection mechanism may enable oversampling to be used on low frequency signals by injecting dither noise into the ADC input. The dither noise can reduce the quantization noise allowing even direct current (DC) signals to be oversampled correctly.

A low-cost charge injection mechanism can also be used to improve the ENOB by characterizing the ADC and digitally correcting the converted signal for non-linearity errors such as INL. Reducing INL errors may also allow a higher degree of oversampling to be used to further improve the ENOB.

Particular embodiments of the invention can be implemented to realize one or more of the following advantages: 1) a low cost ADC dithering mechanism to reduce quantization noise in the ADC output, 2) a low cost ADC characterization mechanism for characterizing INL errors, and 3) a method for reducing INL errors from ADC measurements.

DETAILED DESCRIPTION

Exemplary Embedded ADC with Current Injection Mechanism

Figure 1:
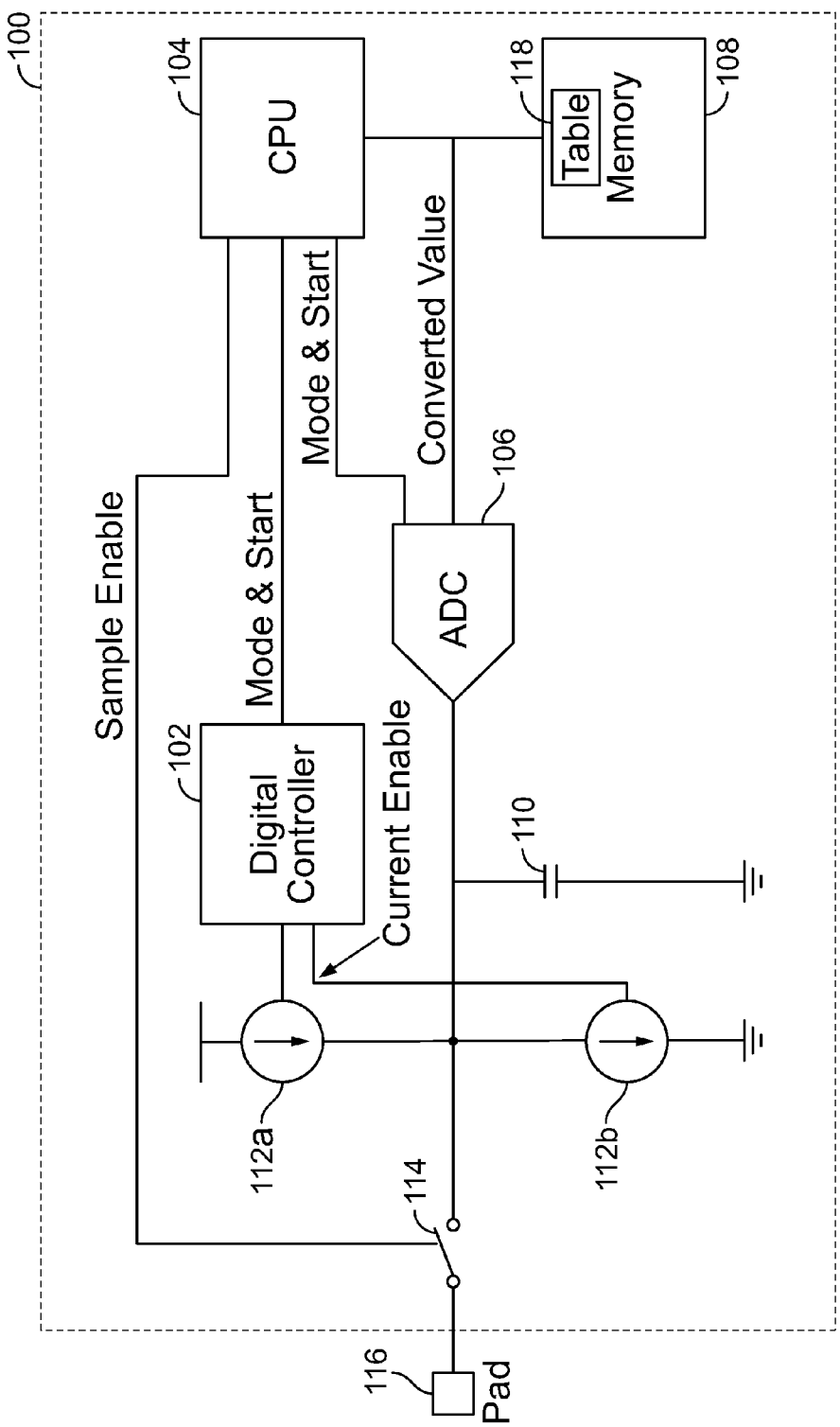
FIG. 1 is a block diagram of an exemplary microcontroller with embedded ADC and current injection/removal mechanism.

FIG. 1 is a block diagram of an exemplary integrated circuit device 100 with embedded ADC and current injection/removal mechanism. In some implementations, integrated circuit device 100 can include a digital controller 102, central processing unit (CPU) 104, ADC 106, memory 108, sample-and-hold capacitor 110, controllable current sources 112a, 112b, switch 114 and pad 116. An example of an integrated circuit device 100 with an embedded ADC is a microcontroller.

Current sources 112a, 112b can be turned on and off by digital controller 102 and are coupled to sample-and-hold capacitor 110 used by ADC 106. Current sources 112a, 112b can be controlled by high-speed logic in digital controller 102. During a hold phase, after the input analog signal on pad 116 is sampled by switch 114 and stored on sample-and-hold capacitor 110, digital controller 102 injects or removes a configurable amount of charge by turning on current source 112a or 112b for a configurable number of clock periods. By controlling the number of clock periods for which current source 112a or current source 112b is on, the amount of charge injected or removed can be controlled.

Operation of Charge Injection/Removal Mechanism

The charge injection/removal mechanism operates as follows: First, the analog input signal is sampled by closing switch 114, which connects the analog input signal on pad 116 to sample-and-hold capacitor 110. This connection will charge capacitor 110 to the analog input voltage and track the voltage until the connection is broken by opening switch 114. In some implementations, the control of switch 114 is provided by a sample enable signal provided by CPU 104. Next, a charge injection or removal is performed. This is accomplished by turning one of current sources 112a, 112b which either injects or removes (e.g., drains) a portion of the charge on capacitor 110 by changing the direction of current flow. For example, charge can be added to capacitor 110 by turning current source 112a on and turning current source 112b off. This configuration results in current flow into capacitor 110, thus adding charge to capacitor 110. Charge can be removed from capacitor 110 by turning current source 112a off and turning current source 112b on. This configuration results in current flow out of capacitor 110 to ground.

The amount of charge injected or removed is controlled by current source on-time. The charge injected or removed affects the voltage over capacitor 110 proportionally and so the ADC measurement. Digital controller 102 selects which current source 112a, 112b to enable and determines the on-time for that current source. Lastly, the sampled and modified analog input signal is converted to a digital value by ADC 106.

In some implementations, ADC 106 can include a built-in, sample-and-hold capacitor. For such converters, external sample-and-hold capacitor 110 is not needed and current sources 112a, 112b are instead connected directly to the internal sample-and-hold capacitor. Current sources 112a, 112b can be insensitive to output voltage and can output the same amount of current no matter the voltage present on capacitor 110, as long as the voltage is within the operational range of current sources 112a, 112b. The non-linearity caused by current source output voltage dependence can be much less than the inherit non-linearity in ADC 106.

Current sources 112a, 112b are controlled by digital controller 102. Digital controller 102 is responsible for controlling the on-time of current sources 112a, 112b. On-time for current sources 112a, 112b can be determined by a number of high frequency clock cycles for which current source 112a or current source 112b is enabled. The amount of charge injected or removed can be directly proportional to the on-time. To allow high resolution on the injected charge, digital controller 102 can time the on signal using a high frequency clock. High-speed digital logic in digital controller 102 can be programmed to cover multiple resolution requirements. To inject a controlled amount of charge, a count value can be programmed into digital controller 102. In some implementations, when the current injection/removal window is open, current source 112a or 112b is turned on and digital controller 102 starts counting from the programmed value down to zero. When zero is reached, current source 112a or 112b can be turned off.

Exemplary Dithering Process

The charge injection/removal mechanism described above can be used to add dither noise to the analog input of ADC 106 to reduce the quantization effect from the analog-to-digital conversion process. The dither noise can be white noise to trigger multiple quantization codes when converted by ADC 106. White noise can be approximated by injecting a pseudo random charge that is between +/−1 LSB.

In some implementations, calibration can be used to add an LSB-relative charge using current source 112a and an on-time. Calibration can be performed by sampling a random value and adding a small amount of charge repeatedly until ADC 106 changes code two times. The accumulated on-time for the charges added from the first ADC code to the next ADC code gives the desired on-time for 1 LSB increase or decrease. This same procedure can be repeated to remove an LSB-relative charge using current source 112b, as current sources 112a, 112b may not be equal in strength.

A range of different pseudo random number generator algorithms can be used to generate scaling vectors for the 1 LSB on-times. An example pseudo random number generator is the Linear Feedback Shift Register (LFSR). For example, if a 5 bit LFSR is used, a maximum of 32 different random noise components can be generated, where 5'b11111 represents the 5 bit binary value of the decimal 31, and is a maximum value for the noise component. The most significant bit (MSB) can be reserved for current direction (e.g., inject or remove charge), and the 4 LSB bits can be used to scale the on-time.

One way to scale the on-time randomly can be to multiply a pre-divided version of the 1 LSB on-time with the LFSR output. The pre-divided version of the 1 LSB on-time is simply the 1 LSB on-time divided by the maximum random value, which is equal to 16 in this example. Dividing by 16 can be accomplished by right shifting the operand by 4, so no division unit is needed. The result is then digitally multiplied by the 4-bit LFSR output to create the correctly scaled random on-time.

Noise scaling does not need to be accurate so instead of digitally dividing the noise component by 16 and then multiplying by the LFSR, current sources 112a, 112b can be extended to allow 4-bit analog scaling. Low accuracy current scaling is typically not expensive and can be implemented by allowing 16 different divided reference currents to be selected. For such resolution, the on-time can be calibrated for 1 LSB at full gain, and during dither operation, the LFSR output, except for the sign bit, can be connected directly to a reference multiplexer (MUX) control of the current source. Noise can then be generated by randomly controlling the reference MUX while keeping the on-time constant.

In another implementation, which does not require either digital multiplication or analog scaling, random numbers are generated using a LFSR with more than enough bits and only use the number of bits closest to the calibrated 1 LSB range. For instance, if calibration reveals that a 40 cycle on-time is needed to increment 1 LSB, the number of bits needed to encode 40 noise components plus one sign bit is 7. So 7 bits from the LFSR to control direction and the on-time which allows an on-time of maximum 64 cycles. By doing this, the maximum noise level will be 1 LSB above the target of +/−1 LSB, which does not significantly increase SNR.

Exemplary Characterization Process

The current injection mechanism described above can be used to characterize ADC 106 in both a normal and an over-sample mode. The results of characterization can be used to digitally correct the non-linearity of ADC 106. This allows the ENOB to be increased. In addition, the improvements in linearity allow oversampling and average to be used to further increase ENOB.

To characterize ADC 106, a linear sweep within the range of interest can be performed using the current injection mechanism. Sample-and-hold capacitor 110 can first be grounded by sampling ground (GND). Then a sequence of charge injection and analog-to-digital conversions can be performed until ADC 106 reaches a predetermined limit. The analog-to-digital conversion values can be stored in memory 108 sequentially. The data stored can be the transfer function for an ideal voltage sweep performed under current operational conditions. This transfer function can then be further post-processed to calculate offset errors, gain errors, INL, differential non-linearity (DNL), etc. The characterization requires no manual intervention and can be performed automatically at some configure time interval to compensate for changing operational conditions.

The non-linearity caused by capacitor 110 current leaks and voltage dependence of current sources 112a, 112b can be an order of magnitude less than the non-linearity in ADC 106. In some implementations, the range of interest can be swept multiple times with different step sizes and/or different directions or even sub ranges to reduce or correct for capacitor leak.

Exemplary INL Correction

Non-linearity errors can be the most important class of ADC errors as they directly limit the ADC ENOB and cannot be reduced by oversampling or filtering. An importance parameter for non-linearity is INL. INL quantifies how ADC 106 output deviates from an ideal linear output. INL errors are caused by physical imperfections in ADC 106 and cause a consistent amount of error for a specific input, given the same operational conditions.

The characterization data collected by sweeping ADC 106 using the charge injection mechanism can be used to build an INL compensation lookup table 118, which can be stored in memory 108. By using the ADC results as a key to lookup table 118, table 118 can have an order O(1) lookup performance.

An exemplary system for INL correction will now be described for a 10-bit ADC 106 with reference to the pseudo code set forth below. ADC 106 is swept using the described charge injection mechanism and the output is stored in table 118, also referred to in this example as "adc_sweep_out." The number of samples are 2000, or about 2 (2000/1024) per code. The maximum and minimum values are the maximum and minimum values give by ADC 106 during the sweep. The maximum value should be 1024 if the input voltage reached the reference voltage and if ADC 106 is ideal.

A function ("ideal_out") calculates the ideal linear values, ignoring offset errors. This output can be used to calculate the INL error per sample in the adc_sweep_out table. The foregoing description can be written in pseudo code as follows (for samples 80-91).

| Building Lookup Table | |
|---|---|
| min = | 0 |
| max = | 1000 |
| count = | 2000 //2 charge injections per code |
| ideal_out(i) = | ((max−min)/count)*i |
| index | 80, 81, 82, 83, 84, 85, 86, 87, 88, 89, 90, 91 |
| adc_sweep_out = | [...40, 40, 42, 43, 44, 44, 45, 46, 47, 48, 48, 49...] |
| ideal_out = | [...40, 40, 41, 41, 42, 42, 43, 43, 44, 44, 45, 45...] |
| lookup = | [... 40, xx, 41, 41, 42, 43, 43, 44, 44, 45...] |
| During Operation | |
| index | 40, 41, 42, 43, 44, 45, 46, 47, 48, 49 (measurement) |
| lookup = | [...40, xx, 41, 41, 42, 43, 43, 44, 44, 45...] (INL corrected measurement) |

The "lookup" table in the pseudo code maps real ADC codes to INL corrected values. The INL corrected value of a measurement can be found by using the measurement as an index into the "lookup" table. For example, if ADC 106 produces the value 48, the INL corrected value can be found by reading lookup [48], which produces the value 44.

The "lookup" table can be built by mapping adc_sweep_out values to ideal_out values using adc_sweep_out values as a table index and ideal_out as table data. For example, to find an INL correction for ADC measurement 48, ideal_out table can be processed to find that 48 corresponds to both ideal values 44 and 45. Then the data in lookup table at index 48 is the average of 44 and 45, i.e., lookup [48]=floor ((44+ 45)/2). If the ADC sweep is missing a whole code, such as 41, it can be ignored and the rest of the lookup table can be filled in. At the end of the process, missing values can be filled in by averaging neighboring values in the table.

The foregoing describes a low cost charge injection/removal mechanism for use with an embedded ADC that injects or removes a controlled amount of charge into/from an ADC sample voltage to allow dithering on the input analog signal and reduce quantization noise. It also allows the characterization of ADC INL errors and digitally corrects for the INL errors, and thus increases ENOB. Correcting INL errors also enables oversampling to be used for further increasing ENOB.

Figure 2:
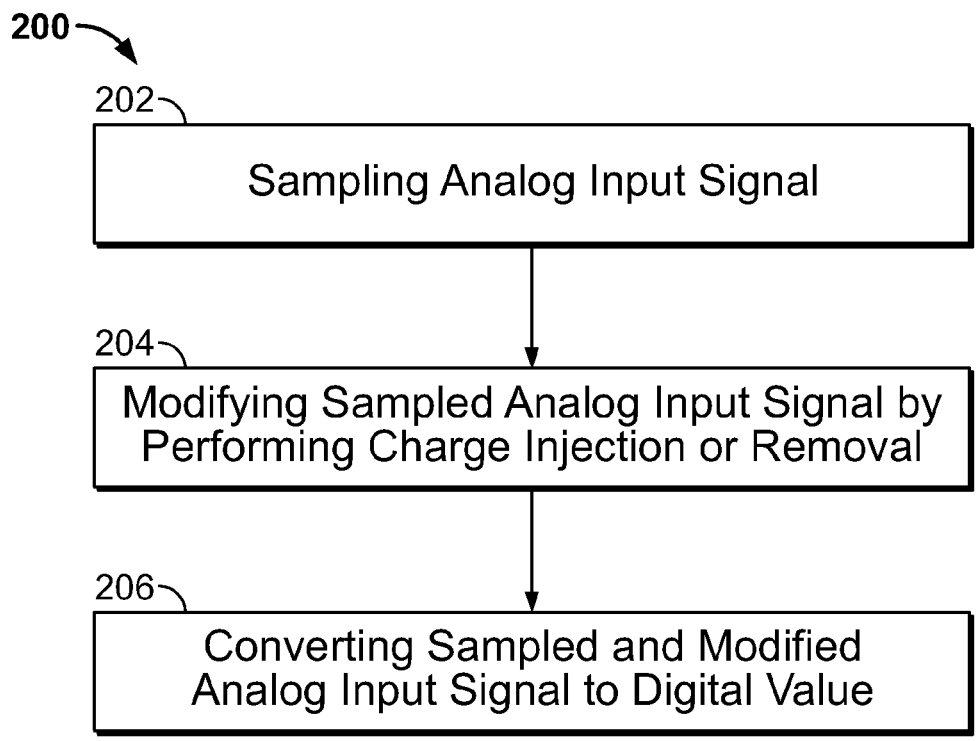
FIG. 2 is a flow diagram of an exemplary charge injection/removal process for the embedded ADC of FIG. 1.

FIG. 2 is a flow diagram of an exemplary charge injection process 200 for the embedded ADC of FIG. 1. Process 200 can be implemented by integrated circuit device 100 of FIG. 1.

In some implementations, process 200 can begin by sampling an analog input signal (202). The analog input signal can be received from a pad of an integrated circuit device. The analog input signal can be sampled by a sample-and-hold circuit, which can include a sample-and-hold capacitor.

Process 200 continues by modifying the sampled analog input signal by injecting or removing a controlled amount of charge to the sample-and-hold circuit (204). In some implementations, the charge is injected into, or removed from, the sample-and-hold circuit using a pair of current sources that are controlled by a high-speed digital controller, as described in reference to FIG. 1. A first current source can be enabled by the digital controller to add charge to the sample-and-hold circuit and a second current source can be enabled by the digital controller to remove charge from the sample-and-hold circuit. The amount of charge injected or removed from the sample-and-hold circuit is determined by current source on-time. For example, the digital controller can control the number of clock periods for which current sources 112a, 112b are turned on or enabled, so that the current sources, 112a, 112b can inject or remove charge from the sample-and-hold circuit, respectively.

Process 200 continues by converting the sampled and modified analog signal to a digital value (206). The digital value can be stored in memory.

Calibration can be used to add a LSB-relative charge to the sampled voltage using the current sources and on-time. Calibration can be performed by sampling a random value and adding a small amount of charge repeatedly until the ADC changes code one or more times (e.g., two times). The accumulated on-time for the charges added from the first ADC code to the next ADC code gives the required on-time for 1 LSB. The same calibration procedure can be performed for the other current source as the current sources may not be perfectly equal. A pseudo random number generator (e.g., a LFSR) can be used to generate scaling vectors for a 1 LSB on-time.

Figure 3:
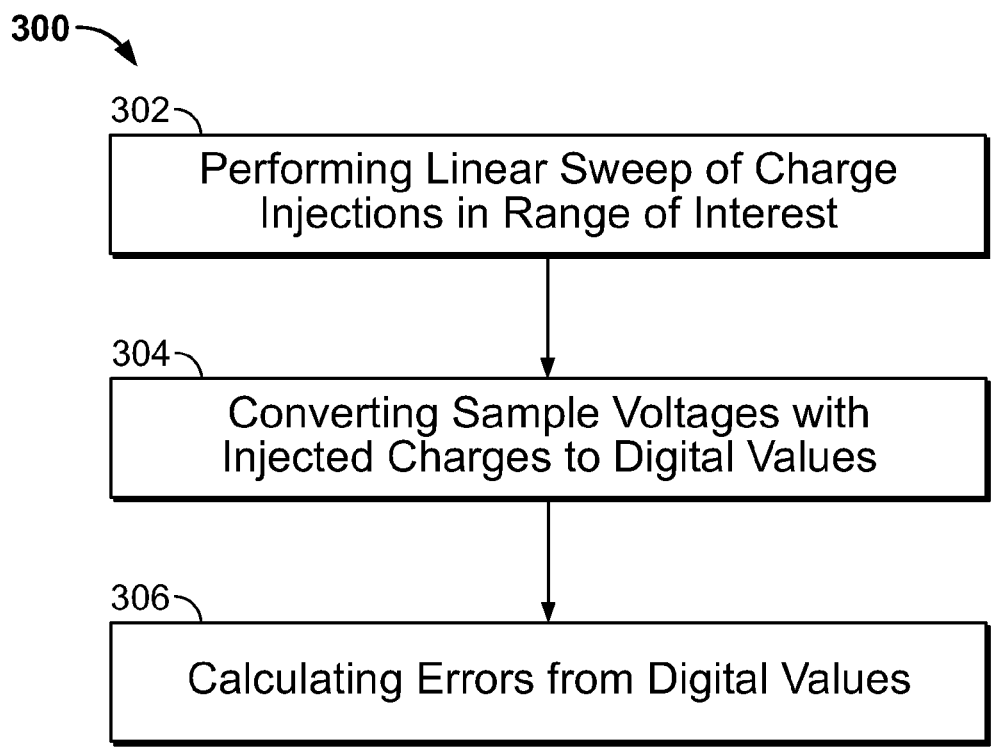
FIG. 3 is a flow diagram of an exemplary ADC characterization process for the embedded ADC of FIG. 1

FIG. 3 is a flow diagram of an exemplary characterization process 300 for the embedded ADC of FIG. 1. Process 300 can be implemented by integrated circuit device 100 of FIG. 1.

In some implementations, process 300 can begin by performing a linear sweep of charge injections in a range of interest (302). For example, a sample-and-hold capacitor can be first grounded by sampling ground. Then a sequence of charge injection and analog-to-digital conversions (304) can be performed until the ADC reaches a predetermined limit. The conversion values can be stored in memory sequentially. The values stored can be the transfer function for an ideal voltage sweep preformed under current operational conditions. The transfer function can be post-processed to calculate errors from the digital values (306). For example, an INL error can be ideal values minus measured values compensated for offset and gain errors. An ith DNL error can be calculated from current and previous INL errors, given by DNL (i)=INL (i)−INL (i−1).

While this document contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. An integrated circuit device, comprising:
a digital controller;
an analog-to-digital converter (ADC) coupled to the digital controller;
a sample-and-hold circuit coupled to an input of the ADC, the sample-and-hold circuit configurable for sampling an analog signal; and
one or more current sources coupled to the controller and the sample-and-hold circuit, the one or more current sources configurable by the controller to inject a controlled amount of charge into the sample-and-hold circuit or to remove a controlled amount of charge stored by the sample-and-hold circuit.

2. The integrated circuit device of claim 1, further comprising:
a controllable switch coupled to the analog input signal; and
a central processing unit coupled to the switch and configurable to control the switch to allow the analog signal to be sampled by the sample-and-hold circuit.

3. The integrated circuit device of claim 1, further comprising:
memory coupled to the processor and an output of the ADC, the memory configurable for storing a digital value resulting from conversion of one or more samples of the analog signal by the ADC.

4. The integrated circuit device of claim 3, further comprising:
compensation data stored in the memory, the compensation data for correcting errors in the digital values, the compensation data generated based on a characterization of the ADC performed by the integrated circuit device using the one or more current sources.

5. The integrated circuit device of claim 1, where the one or more current sources further comprise:
a first current source coupled to the digital controller and the sample-and-hold circuit, where the first current source is turned on by the digital controller for a first on-time to allow charge to be injected into the sample-and-hold circuit; and
a second current source coupled to the digital controller and the sample-and-hold circuit, where the second current source is turned on by the digital controller for a second on-time to allow charge to be removed from the sample-and-hold circuit,
where the digital controller turns only one of the first and second current sources on at a time.

6. The integrated circuit device of claim 1, where the first on-time or the second on-time is calculated to provide one Least Significant Bit (LSB) of charge from the first current source or the second current source, respectively.

7. The integrated circuit device of claim 1, where the sample-and-hold circuit is included in the ADC.

8. The integrated circuit device of claim 1, where the one or more current sources inject or remove random amounts of charge.

9. The integrated circuit device of claim 8, where the random amounts of charge are generated by a Linear Feedback Shift Register (LFSR).

10. A method performed on an integrated circuit device, the method comprising:
sampling an analog input signal using a sample-and-hold circuit;
modifying the sampled analog input signal with a controlled amount of charge generated by one or more current sources controlled by a digital controller; and
converting the modified sampled analog input signal into a digital value using an analog-to-digital converter (ADC).

11. The method of claim 10, further comprising:
generating compensation data on the integrated circuit device using the one or more current sources and the ADC; and
correcting errors in the digital values using the compensation data.

12. The method of claim 11, where generating compensation data further comprises:
performing a linear sweep of charge injections in a range of interest;
converting sample voltages with injected charges to digital values; and
calculating compensation data based on digital values.

13. The method of claim 10, where modifying the sampled analog input signal with a controlled amount of charge generated by one or more current sources controlled by a digital controller, further comprises:
calculating on-time; and
turning on the one or more current sources for a time period substantially equal to the on-time.

14. The method of claim 13, where calculating on-time further comprises:
sampling a random value;
using the one or more current sources to adding a small amount of charge repeatedly to the random value until the ADC changes code one or more times; and
setting the on-time to accumulated on-times for the one or more current sources during the calculating of on-time.

15. A system comprising:
means for sampling an analog input signal using a sample-and-hold circuit;
means for modifying the sampled analog input signal with a controlled amount of charge generated by one or more current sources controlled by a digital controller; and
means for converting the modified sampled analog input signal into a digital value using an analog-to-digital converter (ADC).

* * * * *